(12) United States Patent
Huang

(10) Patent No.: US 7,547,605 B2
(45) Date of Patent: Jun. 16, 2009

(54) MICROELECTRONIC DEVICE AND A METHOD FOR ITS MANUFACTURE

(75) Inventor: Chien-Chao Huang, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 10/994,841

(22) Filed: Nov. 22, 2004

(65) Prior Publication Data

US 2006/0110887 A1    May 25, 2006

(51) Int. Cl.
    *H01L 21/336* (2006.01)
(52) U.S. Cl. ............... 438/296; 438/429; 438/700; 257/E21.633; 257/E21.642
(58) Field of Classification Search ............. 438/296, 438/429, 700; 257/E21.633, E21.642
    See application file for complete search history.

(56) References Cited

U.S. PATENT DOCUMENTS

| | | | |
|---|---|---|---|
| 4,758,531 A | 7/1988 | Beyer et al. | |
| 5,073,810 A * | 12/1991 | Owada et al. | 257/588 |
| 5,086,011 A * | 2/1992 | Shiota | 438/406 |
| 5,212,110 A * | 5/1993 | Pfiester et al. | 438/222 |
| 5,600,161 A | 2/1997 | Gonzalez et al. | |
| 5,763,314 A * | 6/1998 | Chittipeddi | 438/400 |
| 5,994,724 A * | 11/1999 | Morikawa | 257/184 |
| 6,111,267 A * | 8/2000 | Fischer et al. | 257/19 |
| 6,190,975 B1 * | 2/2001 | Kubo et al. | 438/285 |
| 6,319,772 B1 * | 11/2001 | Tee et al. | 438/256 |
| 6,384,437 B1 * | 5/2002 | Tee et al. | 257/239 |
| 6,429,061 B1 * | 8/2002 | Rim | 438/198 |
| 6,455,871 B1 | 9/2002 | Shim et al. | |
| 6,479,354 B2 * | 11/2002 | Moon | 438/269 |
| 6,482,705 B1 | 11/2002 | Yu | |
| 6,492,216 B1 * | 12/2002 | Yeo et al. | 438/197 |
| 6,503,812 B2 * | 1/2003 | Menut et al. | 438/412 |
| 6,621,131 B2 | 9/2003 | Murthy et al. | |
| 6,630,710 B1 * | 10/2003 | Augusto | 257/327 |
| 6,703,271 B2 * | 3/2004 | Yeo et al. | 438/221 |
| 6,707,132 B1 * | 3/2004 | Banerjee et al. | 257/616 |
| 6,787,423 B1 * | 9/2004 | Xiang | 438/296 |
| 6,951,796 B2 * | 10/2005 | Sakaguchi | 438/413 |
| 2003/0077882 A1 | 4/2003 | Shih et al. | |

(Continued)

OTHER PUBLICATIONS

John C. Hughes et al., "Effects of Epitaxial Silicon Technology on the Manufacturing Performance of Wafer Fabrication Lines", 1998, pp. 333-336, 0-7803-4523-1/98, IEEE/CMPT Int'l Electronics Manufacturing Technology Symposium.

(Continued)

*Primary Examiner*—Charles D. Garber
*Assistant Examiner*—Stanetta D Isaac
(74) *Attorney, Agent, or Firm*—Haynes and Boone, LLP

(57) ABSTRACT

Provided are a microelectronic device and a method for its manufacture. In one example, the method includes providing a semiconductor substrate layer having a first material (e.g., silicon or silicon germanium). An insulating layer is formed on the semiconductor substrate layer with multiple openings exposing portions of the surface of the semiconductor substrate layer. A semiconductor layer is then formed in the openings directly upon the exposed portions of the semiconductor substrate layer using a second material different from the first material (e.g., silicon germanium or silicon). In other examples, multiple semiconductor layers may be formed using alternating materials.

33 Claims, 3 Drawing Sheets

U.S. PATENT DOCUMENTS

2003/0162348 A1 8/2003 Yeo et al.
2003/0207571 A1* 11/2003 Fitzgerald et al. ........... 438/689

OTHER PUBLICATIONS

Shannon Chen et al., "Yield of Silicon Selective Epitaxial Growth And Its Role In The Production Planning And Control Of Three-Dimensional Semiconductor Devices", 1996, pp. 212-217, 0-7803-3642/96, IEEE/CMPT Int'l Electronics Manufacturing Technology Symposium.

Xiang-Zheng Bo, et al., "Spatially Selective Single-Grain Silicon Films Induced By Hydrogen Plasma Seeding", May/Jun. 2002, pp. 818-821, 1071-1023/2002/20(3)/818/4, J. Vac. Sci. Technol. B 20(3), American Vacuum Sociey.

www.fz-juelch.de/isg/lpcvd/lv4.html, 3 pages, May, 2004.

Hsiang-Jen Huang et al., "Improved Low Temperature Characteristics of P-Channel MOSFETs With $Si_{1-x}Ge_x$ Raised Source Drain", Aug. 2001, pp. 1627-1632, vol. 48, No. 8, 0018-9383/01, IEEE Trasactions on Electrical Devices.

http://ece.www.ecn.purdue.edu/ECE/Research/ARS/ARS98/PART_I/Section7/7_24, School of Electrical & Computer Engineering—Annual Research Summary, 2 pages, Jul. 1, 1997-Jun. 30, 1998.

* cited by examiner

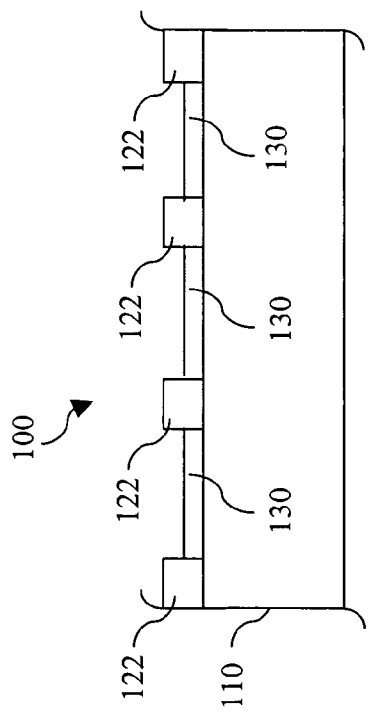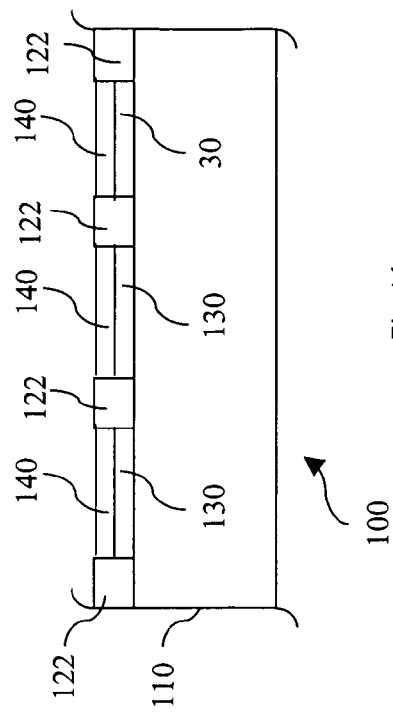
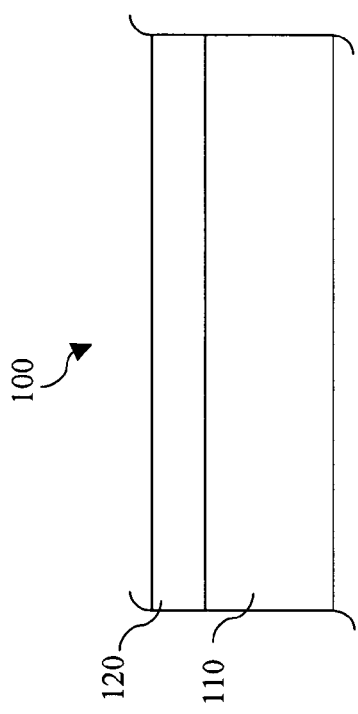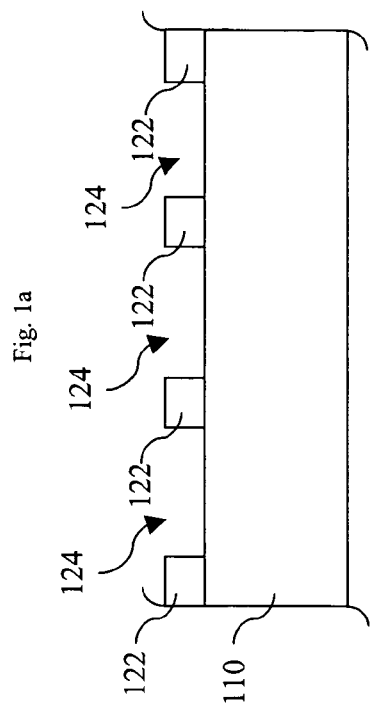

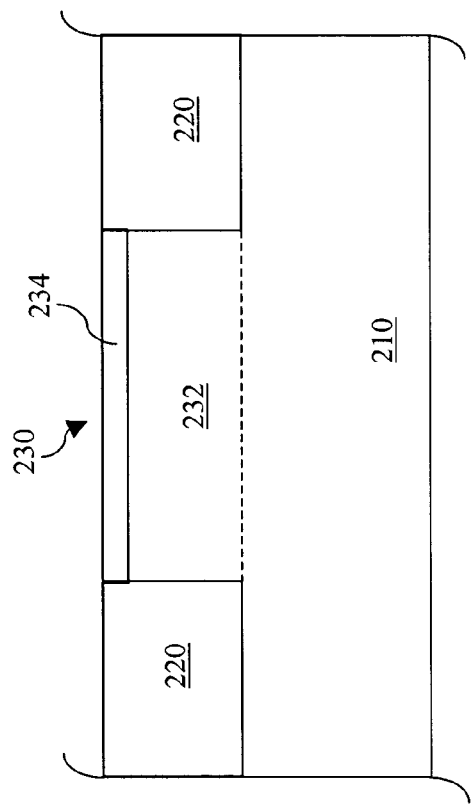
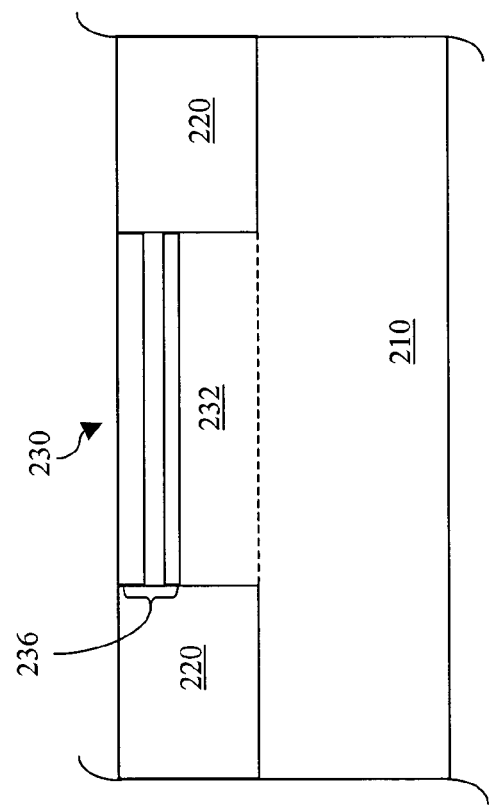

MICROELECTRONIC DEVICE AND A METHOD FOR ITS MANUFACTURE

BACKGROUND

An integrated circuit (IC) is formed by creating one or more devices (e.g., circuit components) on a semiconductor substrate. Generally, each device is separated from the other devices using an isolation feature such as a shallow trench isolation (STI) structure. Current STI structures are often formed using a process that includes etching and silicon oxide deposition. However, high stress may be induced into an STI structure, such as stress caused in etching the profile corner. The high stress may cause a leakage current that affects the performance of the resulting device. The reduction in size of device geometries used in modern technology nodes may make the leakage issue worse and may also cause other issues, including STI gap filling issues and a degradation of carrier mobility under the high stress caused by the STI process.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 1a-1d are sectional views of at least a portion of one embodiment of a semiconductor structure during various manufacturing stages according to aspects of the present disclosure.

FIG. 2a is a sectional view of at least a portion of one embodiment of a semiconductor structure according to aspects of the present disclosure.

FIG. 2b is a sectional view of at least a portion of another embodiment of a semiconductor structure according to aspects of the present disclosure.

DETAILED DESCRIPTION

Figure 3:
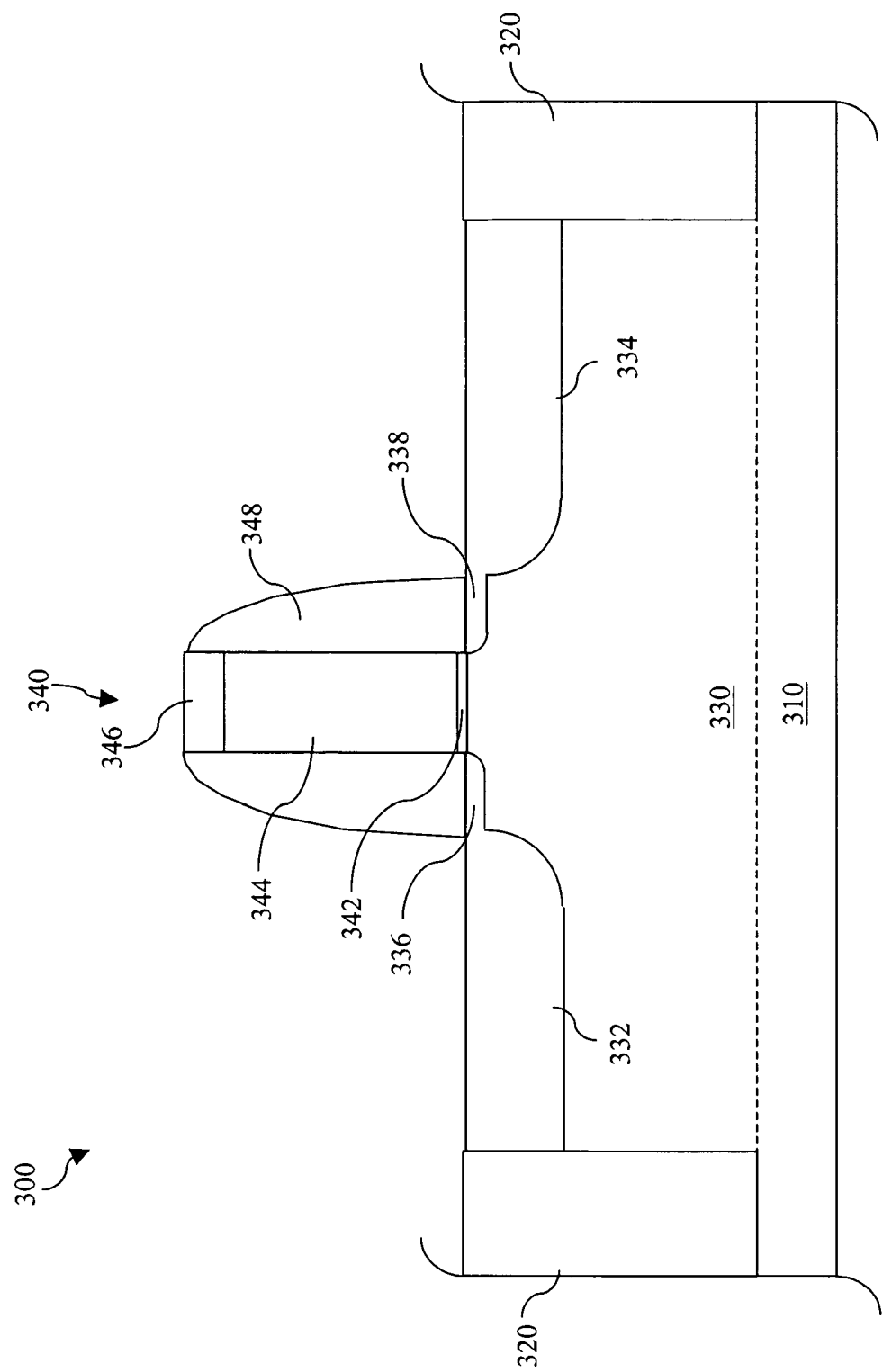
FIG. 3 is a sectional view of at least a portion of another embodiment of a semiconductor device according to aspects of the present disclosure.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Referring to FIGS. 1a-1d, illustrated are sectional views of at least a portion of one embodiment of a semiconductor structure 100 during various manufacturing stages according to aspects of the present disclosure. The semiconductor structure 100 includes a structural layer 110 that may include a crystal semiconductor layer such as silicon and silicon germanium, may have a certain crystal orientation, such as <100>, <110>, or <111>, and may have a surface orientation of (100), (110), or (111). Reference herein to any layer as a crystal layer may include single-crystal layers and other layers. The structural layer 110 may also or alternatively include silicon, gallium arsenide, gallium nitride, silicon germanium, silicon carbide, carbide, diamond, combinations thereof, and/or other semiconductor materials. The structural layer 110 may also include a silicon-on-insulator (SOI) structure, such as a silicon-on-sapphire substrate, a silicon germanium-on-insulator (GOI) substrate, or a buried oxide (BOX) layer.

Referring to FIG. 1a, illustrated is a sectional view of the semiconductor structure 100 in an intermediate stage of manufacture according to aspects of the present disclosure. An insulation layer 120 may be formed on the structural layer 110. The insulation layer 120 may be a single layer structure formed of a material such as silicon dioxide ($SiO_2$), or may be a multi-layer structure formed using $SiO_2$, silicon nitride ($Si_xN_y$), silicon carbide (SiC), silicon germanium (SiGe), low-k materials, combinations thereof, and/or other materials. In one embodiment, the insulation layer 120 substantially comprises materials having a dielectric constant greater than about 3.0, separately or collectively. The insulation layer 120 may be formed by a process such as thermal oxidation, chemical-vapor deposition (CVD), physical-vapor deposition (PVD), atomic layer deposition (ALD), spin-on, or a combination thereof.

Referring to FIG. 1b, illustrated is a sectional view of the semiconductor structure 100 shown in FIG. 1a in a subsequent stage of manufacture according to aspects of the present disclosure. The insulation layer 120 may be patterned to form a plurality of openings 124 that at least partially expose the surface of the structural layer 110. In the present example, the insulation layer 120 is etched to form patterned insulation structures 122 that are separated by the openings 124. The openings 124 may be formed using conventional photolithographic patterning and etching procedures. For example, the openings 124 may be formed by patterning the surface of the insulation layer with a sequential process that includes photoresist patterning, drying etching the insulation layer 120 to expose the underlying structural layer 110, and photoresist stripping. Each of these steps may be further divided into substeps. For example, the photoresist patterning may include photoresist coating, softbaking, mask alignment, pattern exposure, photoresist development, and hard baking. The depth of the patterned openings 124 may range from about 2000 Angstroms to about 7000 Angstroms.

Referring to FIG. 1c, illustrated is a sectional view of the semiconductor structure 100 shown in FIG. 1b in a subsequent stage of manufacture according to aspects of the present disclosure. A first semiconductor layer 130 is formed in one or more of the openings 124 of the insulation layer 120. The first semiconductor layer 130 may be formed using a semiconductor material such as silicon, silicon germanium, silicon carbide, and/or other materials in a crystal structure. The thickness of the first semiconductor layer 130 may range from about 2000 Angstroms to about 5000 Angstroms, and may be formed by a process such as selective epitaxial growth (SEG). Alternatively, the first semiconductor layer 130 may be formed by other methods, such as simultaneous crystal/poly deposition or simultaneous single-crystal/poly deposition (collectively referred to herein as SSPD), CVD, PVD, ALD, and/or other processing techniques. Reference herein to any crystal or crystal/poly deposition may include single-crystal or single-crystal/poly deposition.

In one example, silicon comprising the first semiconductor layer 130 may be formed by a SEG process using hydrochloric acid (HCl) and dichlorosilane (DCS) under predefined processing parameters. The processing parameters may include a processing temperature ranging between about 500° C. and 1100° C., a HCl gas flow ranging between about 15 standard cubic centimeters per minute (sccm) and about 200 sccm, and a DCS gas flow ranging between about 10 sccm and about 300 sccm. A pressure for the process may range between about 10 torr and about 250 torr.

In another example, silicon germanium comprising the first semiconductor layer 130 may be formed by a SEG process using HCl and germane ($GeH_4$) under predefined processing parameters. The processing parameters may include a processing temperature ranging between about 400° C. and 900° C. The processing parameters may include a HCl gas flow ranging between about 15 sccm and about 200 sccm, and a $GeH_4$ gas flow ranging between about 20 sccm and about 200 sccm. A pressure for the process may range between about 10 torr and about 250 torr.

In yet another example, a crystal semiconductor layer comprising the first semiconductor layer 130 may be formed by a non-selective epitaxial growth such as SSPD. For example, silicon may be deposited non-selectively in an epi reactor. This deposits polysilicon over the oxide regions (e.g., on the insulation structures 122), but produces crystal silicon in the exposed crystal areas, such as the openings 124 in the patterned insulation layer 120. If non-selective epi growth is implemented, then another processing step may be added to remove polysilicon formed on the insulation structures 122 by a method such as chemical mechanical planarization (CMP).

Referring to FIG. 1d, illustrated is a sectional view of the semiconductor structure 100 shown in FIG. 1c in a subsequent stage of manufacture according to aspects of the present disclosure. A second semiconductor layer 140 may be formed over the first semiconductor layer 130 within the openings 122 of the insulation layer 120. The second semiconductor layer 140 may include silicon, silicon germanium, silicon carbide, and/or other materials. The second semiconductor layer 140 may be formed by a process similar to those used in forming the first semiconductor layer 130 described above. The thickness of the second semiconductor layer 140 may range from about 50 Angstroms to about 1000 Angstroms.

Different combinations of semiconductor materials may be used to create the semiconductor structure 100. For example, the structural layer 110, the first semiconductor layer 130, and the second semiconductor layer 140 may include silicon, silicon, and silicon germanium, respectively. Other combinations of the structural layer, the first semiconductor layer, and the second semiconductor layer may include silicon, silicon germanium, and silicon; silicon germanium, silicon, and silicon germanium; or silicon germanium, silicon germanium, and silicon.

Although not shown, additional semiconductor layers may be formed over the first and second semiconductor layers using materials and processes similar to those used to form the first and second semiconductor layers. Furthermore, other layers, interconnects, vias, isolation features, and similar structures may be used with the semiconductor structure 100.

Referring to FIG. 2a, illustrated is a sectional view of at least a portion of one embodiment of a semiconductor structure 200 according to aspects of the present disclosure. The semiconductor structure 200 may include a structural layer 210, an insulation layer 220 having a plurality of openings, and a semiconductor island 230 formed within one or more of the openings within the insulation layer 220.

The structural layer 210 and insulation layer 220 may be similar to the structural layer 110 and insulation layer 120 described with respect to FIGS. 1a-1d, and may be constructed using manufacturing methods that are identical or similar to those described in the formation of the structural layer 110 and insulation layer 120. For example, the structural layer 210 may comprise silicon or silicon germanium. Alternatively, the structural layer 210 and insulation layer 220 may include other materials and may be formed by alternate and/or future developed manufacturing techniques.

In the present example, the semiconductor island 230 includes a first semiconductor layer 232 and a second semiconductor layer 234. The second semiconductor layer 234 is formed from a material different from that of the first semiconductor layer 232. The first and/or second semiconductor layer(s) may include Si, SiGe, SiC, combinations thereof, and/or other materials. The semiconductor island 230 may be formed by an epi growth process such as SEG, SSPD, and/or other processing techniques. The material compositions and/or techniques of manufacturing the semiconductor island 230 may be similar to those described previously with respect to the semiconductor layers 130 and 140. The second semiconductor layer 234 may also include semiconductor dopants, such as boron, phosphorus, arsenic, and/or other materials. As one example, the first semiconductor layer 232 may comprise silicon and the second semiconductor layer 234 may comprise silicon germanium, or vice versa.

Different combinations of materials may be used for the structural layer 210, the first semiconductor layer 232, and the second semiconductor layer 234. More specifically, the structural layer 210, the first semiconductor layer 232, and the second semiconductor layer 234 may include silicon, silicon, and silicon germanium, respectively. Other combinations of the structural layer 210, the first semiconductor layer 232, and the second semiconductor layer 234 may include silicon, silicon germanium, and silicon; silicon germanium, silicon, and silicon germanium; or silicon germanium, silicon germanium, and silicon. These various combinations are summarized below in Table 1.

TABLE 1

| Structural Layer | First Semiconductor Layer | Second Semiconductor Layer |
| --- | --- | --- |
| Si | Si | SiGe |
| Si | SiGe | Si |
| SiGe | Si | SiGe |
| SiGe | SiGe | Si |

The first semiconductor layer 232 may have a thickness ranging from about 2000 Angstroms to about 5000 Angstroms and the second semiconductor layer 234 may have a thickness ranging from about 50 Angstroms to about 1000 Angstroms.

Referring to FIG. 2b, illustrated is a sectional view of at least a portion of another embodiment of the semiconductor structure 200 shown in FIG. 2a according to aspects of the present disclosure, in which the semiconductor island 230 is illustrated with the first semiconductor layer 232 and a plurality of semiconductor layers 236, 238, and 240 formed over the first semiconductor layer. Although three semiconductor layers are shown for purposes of example, the layers 236, 238, and 240 may represent any number of layers equal to or greater than three.

An exemplary semiconductor structure using the layers 236, 238, and 240 may be configured with the structural layer 210, the first semiconductor layer 232, and the layers 236, 238, and 240 comprising silicon or silicon germanium in different combinations. Each of the plurality of semiconductor layers 236, 238, and 240 may include silicon, silicon germanium, silicon carbide (SiC), or combinations thereof. One or more of the semiconductor layers 236, 238, and 240 may comprise the same material or all the layers may have different combinations of material. In some embodiments, the semiconductor layers may be formed of a crystal structure using a process such as SEG or SSPD. One or more of the semiconductor layers may also include semiconductor dopants, such as boron, phosphorus, and arsenic.

The number of semiconductor layers 236, 238, and 240, the semiconductor material used to form each layer, and the thickness of each layer may be designed in various combinations and configurations adapted to provide pre-determined electrical properties for a variety of microelectronic devices manufactured thereon. For example, the structural layer 210 may comprise silicon and the first semiconductor layer 132 may comprise silicon or silicon germanium. The plurality of semiconductor layers 236, 238, and 240 (and additional layers) may have a combination such as Si/SiGe/Si/SiGe . . . or SiGe/Si/SiGe/Si . . . .

For the embodiments of the semiconductor structure 200 illustrated in FIGS. 2a and 2b, the insulation layer 220 is first formed and patterned to have openings exposing the underlying structural layer 210. The semiconductor layer 232 is then formed in a crystal structure using an epitaxial (epi) growth method such as SEG or SSPD to fill in some or all of the openings in the insulation layer 220. The epi layer may comprise a semiconductor material different from that of the structural layer 210. For example, silicon may be grown using epi on a silicon germanium substrate such that the silicon layer is strained and its electrical performance is enhanced. Multiple epi layers may be formed by epi growth within the openings of the insulation layer 220 in different combinations to optimize device performance. The depth of the openings may range from about 2000 Angstroms to about 7000 Angstroms, with each layer grown therein formed to a desired thickness to achieve a predefined characteristic. Each silicon germanium layer may have a germanium concentration ranging between about 10 percent and about 50 percent.

The multilayer semiconductor structure (e.g., the layers 232, 234 or the layers 232, 236, 238, 240) formed within each opening of the insulator layer 220 may provide an active region to form a semiconductor device. The top semiconductor layer of the islands (e.g., the layer 240 of FIG. 2b) may further include doped regions in a predefined profile to form semiconductor devices such as a source, a drain, and/or a channel for a metal-oxide-semiconductor (MOS) transistor, or the doped regions may be used to form an emitter, a base, and/or a collector for a bipolar transistor.

Furthermore, the semiconductor island may be tuned by using different layer combinations, including modifying the number of layers, the material of each layer, and the thickness of each layer, to build in a certain stress to optimize device performance such as enhancing carrier mobility. The stress may be tuned to be compressive or tensile. For example, silicon and silicon germanium may be used to form the structural layer 210, the first semiconductor layer 232, and/or the second semiconductor layer 234 in different combinations. Since the crystalline lattice constants of silicon and silicon germanium are different, epitaxy growth of silicon on silicon germanium or silicon germanium on silicon may introduce stress wherein the silicon may be stretched and silicon germanium may be compressed. In another example, silicon carbide may be used as semiconductor material to form the semiconductor layers, or carbon may be alloyed with silicon or silicon germanium for similar purposes.

Each of the semiconductor islands may be formed into a different structure having a different combination of layers, materials, and thicknesses. For example, for a complementary metal-oxide-semiconductor (CMOS) transistor, a negative metal-oxide-semiconductor (NMOS) may use a substrate region having one combination, while a positive metal-oxide-semiconductor (PMOS) may use a substrate region having another combination.

The structural layers may use a different crystalline orientation in order to provide pre-determined electrical and mechanical properties. For example, the structural layer 110 may include silicon with crystalline orientations of <100>, <110>, or <111>, and/or may have a surface orientation of (100), (110), or (111).

Referring to FIG. 3, illustrated is a sectional view of at least a portion of one embodiment of a semiconductor device 300 according to aspects of the present disclosure. The semiconductor device 300 may include a structural layer 310, an isolation feature 320, a semiconductor island 330, and a gate feature 340.

The structural layer 310 may include a crystal semiconductor layer such as silicon and silicon germanium. In another example, the structural layer 310 may include silicon, gallium arsenide, gallium nitride, silicon germanium, silicon carbide, carbide, diamond, combinations thereof, and/or other materials. The structural layer 310 may have a silicon-on-insulator (SOI) structure or another structure to enhance performance of the semiconductor device 300.

The isolation feature 320 may be positioned over the structural layer 310 and be formed using a dielectric layer patterned to have a plurality of openings to expose the underlying structural layer 310. In one example, a dielectric material layer is formed over the structural layer 310 by a process such as CVD, PVD, thermal oxidation, or spin-on coating. The dielectric material may include silicon oxide, silicon oxynitride, silicon nitride, low-k materials, and/or combinations thereof. The dielectric material layer may have a multilayer structure and may be patterned for openings using a process that includes photolithography processing and etching.

The semiconductor island 330 may be located in an opening between two isolation features 320. The semiconductor island 330 may have a structure similar to the semiconductor island 230 illustrated in FIGS. 2a and 2b, and may be fabricated by a method similar to the method described with respect to FIGS. 1a-1d. The semiconductor island 330 may comprise a semiconductor material having a crystal structure, where the semiconductor material may include materials such as silicon, silicon germanium, or silicon carbide. Although shown as a single layer, the semiconductor island 330 may have a multilayer structure and each layer may be formed using a different material/composition. For example, the semiconductor island 330 may include a silicon layer and a silicon germanium layer, while the structural layer 310 may include silicon or silicon germanium. One of the silicon layer and the silicon germanium layer forming the semiconductor island 330, referred to as a first semiconductor layer, is positioned to be in direct contact with the structural layer 310, and may have a thickness ranging from about 2000 Angstroms to about 5000 Angstroms. The other layer of the semiconductor island 330 is positioned in contact with the first semiconductor layer, and may have a thickness ranging from about 50 Angstroms to about 1000 Angstroms. Silicon germanium used in the structural layer 310 and the semiconductor island 330 may have a germanium concentration ranging from about 10 percent to about 50 percent. The semiconductor island may be formed using an epi growth process such as SEG or SSPD. The formed semiconductor island 330 may be strained and enhanced for purposes such as improved carrier mobility.

The semiconductor island 330 may further include doped regions 332 and 334 and light doped regions 336 and 338 of either an n-type dopant or a p-type dopant formed by a conventional doping process such as ion implantation. The doped regions may function as active regions to provide a source, a drain, and a channel for a device such as a MOS transistor.

The gate feature 340 is positioned on the semiconductor island 330. The gate feature 340 may include a gate dielectric 342, a gate electrode 344, a silicide contact layer 346, and spacers 348. The gate dielectric 342 may include silicon oxide, silicon oxynitride, high-k material, and/or combinations, possibly having a dielectric constant greater than about 5.0. The gate dielectric 342 may also have a thickness of less than about 20 Angstroms. The gate electrode 344 may include doped polysilicon, metal, metal silicide, other conductive material, and/or combinations thereof. The silicide contact layer 346 may comprise nickel silicide, cobalt silicide, tungsten silicide, tantalum silicide, titanium silicide, platinum silicide, erbium silicide, palladium silicide, or combinations thereof. The spacers 348 may have a multilayer structure and may include silicon oxide, silicon nitride, silicon oxynitride, or other dielectric material. The spacers 348 may have a thickness of less than about 700 Angstroms.

The structural layer 310 and/or the island layer 330 may have an n-type doped region, a p-type doped region, and/or a combination thereof. N-type dopant impurities employed to form the doped regions may include phosphorus, arsenic, and/or other materials. P-type dopant impurities may include boron, indium, and/or other materials.

As one example, both NMOS and PMOS transistors may be formed in a semiconductor substrate using the structures described above, with an NMOS transistor formed in one semiconductor island and a PMOS transistor formed in another semiconductor island. The two islands may have different combinations of semiconductor materials, concentrations, and thicknesses. For example, one semiconductor island may have a silicon layer and a silicon germanium layer overlying the silicon layer. The other semiconductor island may have a silicon germanium layer and a silicon layer overlying the silicon germanium layer. By using different semiconductor islands for two types of MOS transistors, the performance of the NMOS and PMOS transistors may be tuned and optimized.

The semiconductor device 300 serves as only one example of a device within which various aspects of FIGS. 1a-1d and FIGS. 2a-2b may be implemented. The semiconductor structure 200 and the method of making the same may be used in other semiconductor devices having a pre-designed strained semiconductor substrate, a hetero-semiconductor device, a stress-free isolation structure, or an isolation feature formed by dielectric deposition and then etching instead of etching and then deposition.

The foregoing has outlined features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of manufacturing a shallow trench isolation structure, comprising:
   providing a semiconductor substrate layer having a first crystal material;
   forming an insulating oxide layer on the semiconductor substrate layer;
   etching the insulating oxide layer to provide a plurality of openings exposing portions of a surface of the semiconductor substrate layer, thereby to form from the insulating oxide layer patterned insulation structures that are separated by the openings; and
   forming at least one semiconductor layer only within the openings upon the exposed portions of the semiconductor substrate layer and between and in contact with the patterned insulation structures using a selective epitaxial growth (SEG) process, wherein the at least one semiconductor layer includes a second crystal material different from the first crystal material.

2. The method of claim 1 wherein the first material comprises silicon and the second material at least partially comprises silicon germanium.

3. The method of claim 2 wherein the semiconductor substrate layer has a crystal orientation of <100>, <110>, or <111>.

4. The method of claim 2 wherein the semiconductor substrate layer has a surface orientation of (100), (110), or (111).

5. The method of claim 1 wherein the first crystal material comprises silicon germanium and the second material comprises silicon.

6. The method of claim 1 wherein the first and second crystal materials each comprises at least one of silicon, germanium, and carbon.

7. The method of claim 1 wherein the insulating oxide layer comprises silicon dioxide ($SiO_2$).

8. The method of claim 1 wherein the insulating oxide layer substantially comprises material having a dielectric constant greater than about 3.0.

9. The method of claim 1 wherein forming the semiconductor layer comprises forming a crystal silicon layer using hydrochloride (HCl) and dichlorosilane (DCS).

10. The method of claim 9 wherein forming the semiconductor layer comprises using a gas flow of HCl ranging from about 15 standard cubic centimeters per minute (sccm) to about 200 sccm and a gas flow of DCS ranging from about 10 sccm to about 300 sccm.

11. The method of claim 10 wherein forming the semiconductor layer comprises using a processing temperature ranging from about 500° C. to about 1100° C.

12. The method of claim 1 wherein forming the semiconductor layer comprises forming an epitaxy silicon germanium layer using hydrochloride (HCl) and germane ($GeH_4$).

13. The method of claim 12 wherein forming the semiconductor layer comprises using a gas flow of HCl ranging from about 15 standard cubic centimeters per minute (sccm) to about 200 sccm and a gas flow of $GeH_4$ ranging from about 20 sccm to about 200 sccm.

14. The method of claim 13 wherein forming the semiconductor layer comprises using a processing temperature ranging from about 400° C. to about 900° C.

15. The method of claim 14 wherein forming the semiconductor layer comprises using a processing pressure ranging from about 10 torr to about 250 torr.

16. The method of claim 1 further comprising forming at least one additional semiconductor layer within each of the openings of the insulating layer.

17. A method of manufacturing a shallow trench isolation structure, comprising:
   providing a semiconductor substrate layer that includes a first crystal material;
   forming an insulating layer on the semiconductor substrate layer;
   etching the insulating layer to form a plurality of openings exposing portions of the surface of the semiconductor substrate layer, thereby to form from the insulating layer patterned insulation structures that are separated by the openings; and
   forming a semiconductor island only within each of the openings of the insulating layer and between and in contact with the patterned insulation structures using a selective epitaxy growth (SEG) process, wherein at least one semiconductor island is in direct contact with the surface of the semiconductor substrate layer and a sidewall of a corresponding one of the openings,
   wherein at least one semiconductor island comprises a second crystal material different than the first crystal material.

18. A method of manufacturing a shallow trench isolation structure, comprising:
   forming an insulating layer on a semiconductor substrate;
   etching the insulating layer to form a plurality of openings exposing portions of the surface of the semiconductor substrate, thereby to form from the insulating layer patterned insulation structures that are separated by the openings;
   forming a first crystal layer of a first semiconductor material within each of the openings of the insulating layer and between and in contact with the patterned insulation structures using a selective epitaxy growth (SEG) process; and
   forming a second crystal layer of a second semiconductor material directly on the first crystal layer and only within each of the openings in the insulating layer and laterally adjacent the insulating layer, wherein the second semiconductor material is different from the first semiconductor material.

19. The method of claim 18 wherein the semiconductor substrate comprises one of the first and second semiconductor materials.

20. The method of claim 18 wherein forming the second crystal layer comprises using a selective epitaxy growth (SEG) process.

21. The method of claim 18 wherein forming the second crystal layer comprises using a simultaneous crystal/poly deposition (SSPD) process.

22. The method of claim 18 wherein one of the first and second semiconductor materials comprises silicon and the semiconductor substrate at least partially comprises silicon germanium.

23. The method of claim 18 wherein at least one of the first and second semiconductor materials comprises at least one of silicon, germanium, and carbon.

24. The method of claim 18 wherein the insulating layer comprises silicon dioxide ($SiO_2$).

25. The method of claim 18, wherein the semiconductor substrate comprises a semiconductor material different from the first semiconductor material.

26. The method of claim 18, wherein the semiconductor substrate, the first semiconductor material, and the second semiconductor material comprise silicon, silicon germanium, and silicon, respectively.

27. The method of claim 18, wherein the semiconductor substrate, the first semiconductor material, and the second semiconductor material comprise silicon germanium, silicon, and silicon germanium, respectively.

28. The method of claim 18, wherein the semiconductor substrate, the first semiconductor material, and the second semiconductor material comprise silicon germanium, silicon germanium, and silicon, respectively.

29. The method of claim 18, further comprising forming at least one additional semiconductor layer on the second crystal layer.

30. The method of claim 17 wherein the first crystal material and the second crystal material are semiconductors.

31. The method of claim 17 wherein the first crystal material is selected from the group consisting of SiGe, GaAs, SiC, and C and the second material comprises crystalline silicon.

32. The method of claim 17 wherein the first crystal material comprises crystalline silicon and the second crystal material is selected from the group consisting of SiGe, GaAs, SiC, and C.

33. A method of manufacturing a shallow trench isolation structure, comprising:
   providing first layer on a substrate, wherein the first layer comprises a crystal material comprising at least one of germanium and carbon;
   forming an insulating layer on the first layer, wherein the insulating layer comprises silicon dioxide;
   etching the insulating layer to provide a plurality of openings exposing portions of a surface of the first layer, thereby to form from the insulating layer patterned insulation structures that are separated by the openings;
   forming a second layer directly on the first layer and only within the openings in the insulating layer and laterally adjacent the insulating layer and between and in contact with the patterned insulation structures, including forming a crystal silicon layer using a selective epitaxial growth (SEG) process in which a hydrochloride gas flow ranges between about 15 standard cubic centimeters per minute (sccm) and about 200 sccm, a dichlorosilane gas flow ranges between about 10 sccm and about 300 sccm, and a processing temperature ranges between about 500° C. and about 1100° C.; and
   forming a third layer directly on the second layer and within the openings in the insulating layer, wherein the third layer comprises a semiconductor material.

* * * * *